United States Patent
Saitou

(10) Patent No.: US 11,756,605 B2
(45) Date of Patent: Sep. 12, 2023

(54) SEMICONDUCTOR DEVICE

(71) Applicant: RENESAS ELECTRONICS CORPORATION, Tokyo (JP)

(72) Inventor: Norihiro Saitou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 126 days.

(21) Appl. No.: 17/517,944

(22) Filed: Nov. 3, 2021

(65) Prior Publication Data

US 2022/0165324 A1 May 26, 2022

(30) Foreign Application Priority Data

Nov. 20, 2020 (JP) .................. 2020-193762

(51) Int. Cl.
| | |
|---|---|
| *G11C 7/10* | (2006.01) |
| *G11C 11/4076* | (2006.01) |
| *G11C 11/4093* | (2006.01) |
| *G11C 11/4096* | (2006.01) |
| *G11C 7/22* | (2006.01) |

(52) U.S. Cl.
CPC ........ *G11C 11/4076* (2013.01); *G11C 7/1093* (2013.01); *G11C 11/4093* (2013.01); *G11C 11/4096* (2013.01); *G11C 7/1066* (2013.01); *G11C 7/222* (2013.01); *G11C 2207/2254* (2013.01)

(58) Field of Classification Search
CPC .............. G11C 11/4076; G11C 7/1093; G11C 11/4093; G11C 11/4096; G11C 7/1066; G11C 7/222; G11C 2207/2254
See application file for complete search history.

(56) References Cited

U.S. PATENT DOCUMENTS

| | | | |
|---|---|---|---|
| 7,983,094 B1 * | 7/2011 | Roge .................. | G11C 7/22 365/194 |
| 2008/0048747 A1 * | 2/2008 | Iizuka ................ | G11C 7/1066 327/261 |
| 2009/0015298 A1 * | 1/2009 | Saitou ................ | H03K 5/156 327/108 |
| 2010/0202223 A1 * | 8/2010 | Kuroki ............... | G11C 29/02 365/194 |
| 2012/0113729 A1 * | 5/2012 | Mochizuki ......... | G11C 7/10 365/189.05 |

(Continued)

FOREIGN PATENT DOCUMENTS

JP 2020-046800 A 3/2020

*Primary Examiner* — Mushfique Siddique
(74) *Attorney, Agent, or Firm* — McDermott Will & Emery LLP

(57) ABSTRACT

A semiconductor device capable of decreasing a jitter component is provided. A first calibration circuit searches a second delay value of a data delay circuit while determining a delay value of a strobe delay circuit to be a first delay value that is larger than the minimum value and smaller than the maximum value. A second calibration circuit determines a first corrected delay value and a second corrected delay value by shifting both the first delay value and the second delay value by the same correction value in a direction toward the minimum value, and sets the first corrected delay value and the second corrected delay value to the strobe delay circuit and the data delay circuit, respectively.

7 Claims, 5 Drawing Sheets

(56) References Cited

U.S. PATENT DOCUMENTS

| | | | |
|---|---|---|---|
| 2015/0371692 A1* | 12/2015 | Song | G11C 7/222 |
| | | | 365/189.05 |
| 2019/0187744 A1* | 6/2019 | Chang | G11C 7/1039 |
| 2020/0118612 A1* | 4/2020 | Finn | G11C 7/1093 |

* cited by examiner

SEMICONDUCTOR DEVICE

CROSS-REFERENCE TO RELATED APPLICATION

The disclosure of Japanese Patent Application No. 2020-193762 filed on Nov. 20, 2020, including the specification, drawings and abstract is incorporated herein by reference in its entirety.

BACKGROUND

The present invention relates to a semiconductor device.
There is disclosed a technique listed below.
[Patent Document 1] Japanese Unexamined Patent Application Publication No. 2020-46800

The Patent Document 1 discloses a semiconductor device including an interface circuit for an SDRAM (Synchronous Dynamic Random Access Memory). The interface circuit includes: a first delay circuit delaying a received strobe signal; a plurality of second delay circuits delaying a plurality of received data signals; and a register latching a data of each delay node in the second delay circuits. The interface circuit uses each delay circuit to perform bit de-skew for matching an edge of the strobe signal and an edge of each data signal and data training for positioning the edge of the strobe signal to a center of an effective window of the data signal recognized based on a value of the register.

SUMMARY

For example, in a memory controller targeting a memory such as a DDR (Double Data Rate)-SDRAM, as described in the Patent Document 1, calibration of the bit de-skew and the data training is performed. By this calibration, a delay value of each delay circuit is set to have a value causing the maximum set-up time/hold time of the data signal with respect to the strobe signal. Meanwhile, each delay circuit includes, for examples, a delay element having plural steps. In the delay circuit, the larger the set delay value is, the larger the number of steps of the operating delay element is.

In this case, the increase in the number of steps of the operating delay element is easy to cause the influence of power-supply noises or others. Because of this, there is a risk of increase in a jitter component caused in the data signal or the strobe signal. The increase in the jitter component decreases a margin for the set-up time/hold time. In such a memory, an allowable value of the jitter component is defined by standards in some cases. The increase in the jitter component also has a risk of not satisfying the standards.

Embodiments described later have been made in consideration of the above description, and other objects and novel characteristics of the present invention will be apparent from the description of the present specification and the accompanying drawings.

A semiconductor device according to an embodiment includes first and second delay circuits and first and second calibration circuits. The first delay circuit includes a first delay element having plural steps to which a strobe signal for latching a data signal is input, and delays the strobe signal by an optional delay value between the minimum value and the maximum value by selecting any input or any output of the first delay element having plural steps. The second delay circuit includes a second delay element having plural steps to which a data signal is input, and delays the data signal by an optional delay value between the minimum and the maximum values by selecting any input or any output of the second delay element having plural steps. The first calibration circuit searches a second delay value of the second delay circuit while determining a delay value of the first delay circuit to be a first delay value that is larger than the minimum value and smaller than the maximum value. The second calibration circuit determines a first corrected delay value and a second corrected delay value by shifting both the first delay value and the second delay value by the same correction value in a direction toward the minimum value, and sets the first corrected delay value and the second corrected delay value to the first delay circuit and the second delay circuit, respectively.

According to the embodiment, the jitter component can be decreased.

BRIEF DESCRIPTIONS OF THE DRAWINGS

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

A circuit element configuring each functional block of the embodiment is formed on a semiconductor substrate such as a single crystal silicon by a publicly-known integrated circuit technique such as CMOS (Complementary MOS transistor) although not particularly limited.

Hereinafter, embodiments of the present invention will be described in detail with reference to the accompanying drawings. Note that the same components are denoted by the same reference symbols throughout all the drawings for describing the embodiments in principle, and the repetitive description thereof will be omitted.

First Embodiment

<<Outline of Semiconductor Device>>

Figure 1:
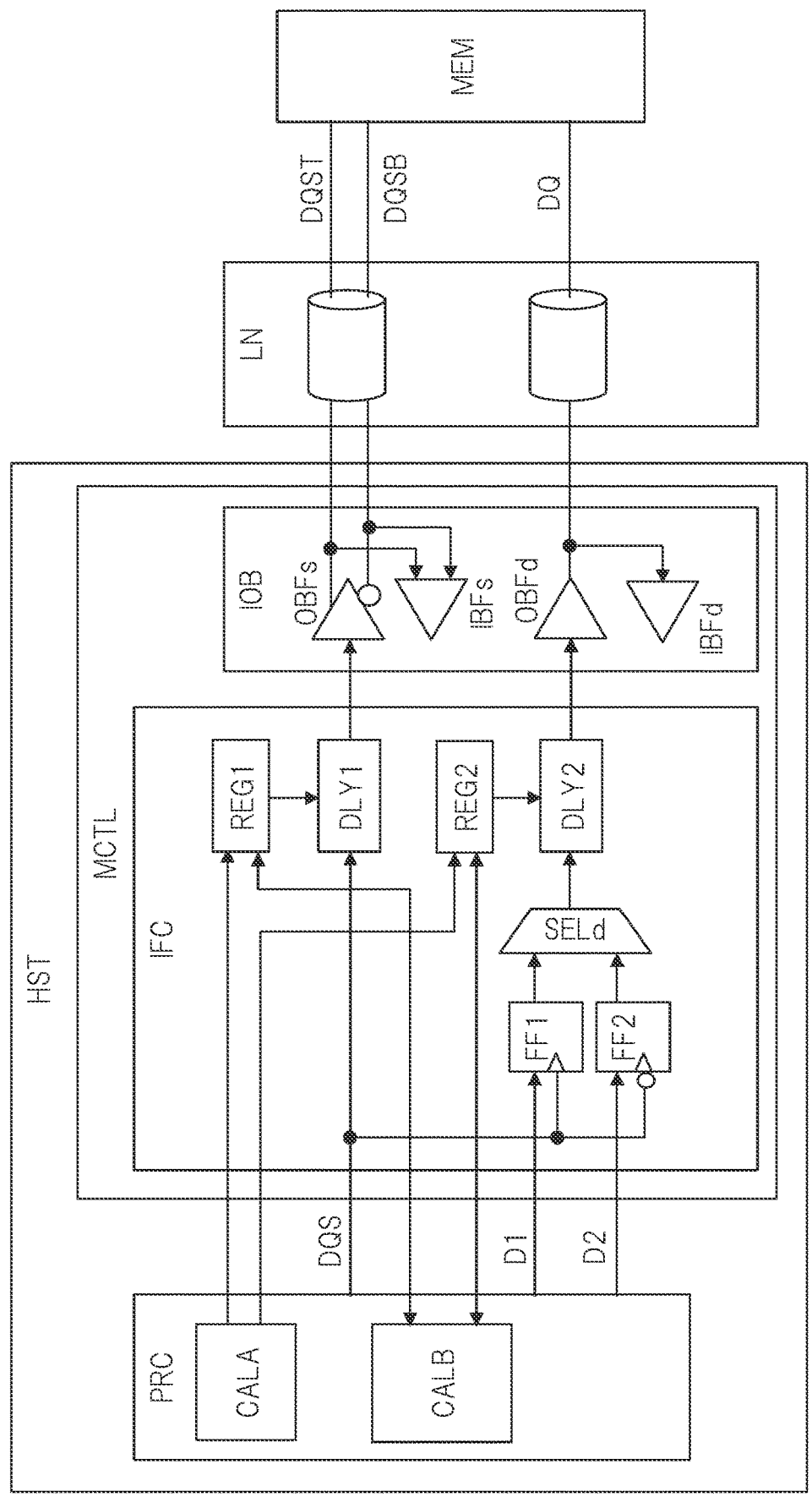
FIG. 1 is a schematic diagram showing a configuration example of a principle part of a semiconductor device according to a first embodiment of the present invention.

FIG. 1 is a schematic diagram showing a configuration example of a principle part of a semiconductor device according to a first embodiment of the present invention. FIG. 1 shows a host controller HST, a memory MEM, and a transmission line LN connecting the host controller HST and the memory MEM. The host controller HST is, for example, an SOC (System On a Chip) made of single semiconductor chip or others. The host controller HST includes a processor PRC and a memory controller MCTL. The memory MEM is made of, for example, single semiconductor chip on which a DRAM, more specifically DDR-SDRAM or others is mounted.

In this case, a configuration of FIG. 1 is achieved in, for example, single package or a form of a PCB (Printed Circuit Board) on which a plurality of components are mounted. In the former case, each semiconductor chip of the host controller HST and the memory MEM is mounted on, for example, a package board, that is a substrate included in the package. In this case, the transmission line LN corresponds to a wiring, a via, a bump or others on the package substrate.

On the other hand, in the latter case, each semiconductor chip of the host controller HST and the memory MEM is individually packaged and mounted on the PCB. In this case, the transmission line LN corresponds to a wiring, a via, a bump or of hers on the PCB. The semiconductor device of the first embodiment corresponds to a semiconductor chip configuring, for example, the host controller HST of FIG. 1. Alternatively, the semiconductor device of the first embodiment corresponds to the package on which the entire components of FIG. 1 are mounted, in other words, to the host controller HST, the transmission line LN and the memory MEM.

The processor PRC includes two calibration circuits CALA and CALB. In other words, the two calibration circuits CALA and CALB are mounted on the processor PRC when the processor PRC executes a program stored in a RAM/ROM (not illustrated) in the host controller HST. The processor PRC transmits data signals D1 and D2 and a strobe signal DQS to the memory controller MCTL when performing writing access to the memory MEM.

The strobe signal is a signal for latching the data signal at any position. In an example of FIG. 1, the strobe signal DQS is a signal for latching the data signals D1 and D2 in the memory controller MCTL. Note that the processor PRC specifically performs reading access in addition to the writing access to the memory MEM. In the case of the reading access, the processor PRC receives the data signal and the strobe signal from the memory controller MCTL, and latches the data signal by using this strobe signal although not illustrated. In this manner, the processor PRC transmits or receives the data signals D1 and D2 and the strobe signal DQS to or from the memory controller MCTL and the memory MEM.

The memory controller MCTL includes an input/output buffer circuit IOB and an interface circuit IFC. The interface circuit IFC includes a strobe delay circuit DLY1, a data delay circuit DLY2, registers REG1 and REG2, flip flops FF1 and FF2, and a selector SELd. The strobe delay circuit DLY1 having received the strobe signal DQS as its input delays the strobe signal DQS by an optional delay value between the minimum value and the maximum value. The register REG1 determines the delay value of this strobe delay circuit DLY1 based on the setting made by the calibration circuits CALA and CALB in the processor PRC.

The flip flop FF1 latches the data signal D1 at a rising edge of the strobe signal DQS. The flip flop FF2 latches the data signal D2 at a falling edge of the strobe signal DQS. The selector SELd alternately selects the data signal D1 that has been latched by the flip flop FF1 and the data signal D2 that has been latched by the flip flop FF2 within one period of the strobe signal DQS.

The data delay circuit DLY2 having received the data signals D1 and D2 as its input from the selector SELd delays the data signals D1 and D2 by an optional delay value between the minimum value and the maximum value. The register REG2 determines the delay value of this data delay circuit DLY2 based on the setting made by the calibration circuits CALA and CALB in the processor PRC. Note that details of the calibration circuits CALA and CALB will be described later.

The input/output buffer circuit IOB includes strobe output buffer OBFs/strobe input buffer IBFs and data output buffer OBFd/data input buffer IBFd. The strobe output buffer OBFs receives the strobe signal from the strobe delay circuit DLY1 at the time of the writing access to the memory MEM, and converts this strobe signal into strobe signals DQST and DQSB that become differential signals. Then, the strobe output buffer OBFs transmits the converted strobe signals DQST and DQSB to the memory MEM through the transmission line LN.

The strobe input buffer IBFs receives the strobe signals DQST and DQSB that become the differential signals from the memory MEM through the transmission line LN at the time of the reading access to the memory MEM, and converts the differential signals into a strobe signal that is single signal. Then, the strobe input buffer IBFs outputs the converted strobe signal to the interface circuit IFC although not illustrated.

The data output buffer OBFd receives the data signals D1 and D2 from the strobe delay circuit DLY2 at the time of the writing access to the memory MEM, and transmits these data signals D1 and D2 as a data signal DQ to the memory MEM through the transmission line LN. The data input buffer IBFd receives the data signal DQ from the memory MEM through the transmission line LN at the time of the reading access to the memory MEN. Then, the data input buffer IBFd outputs the received data signal to the interface circuit IFC although not illustrated. Note that the interface circuit IFC performs a process or others for latching the data signal that is output from the data input buffer IBFd by the strobe signal that is output from the strobe input buffer IBFs.

Figure 2:
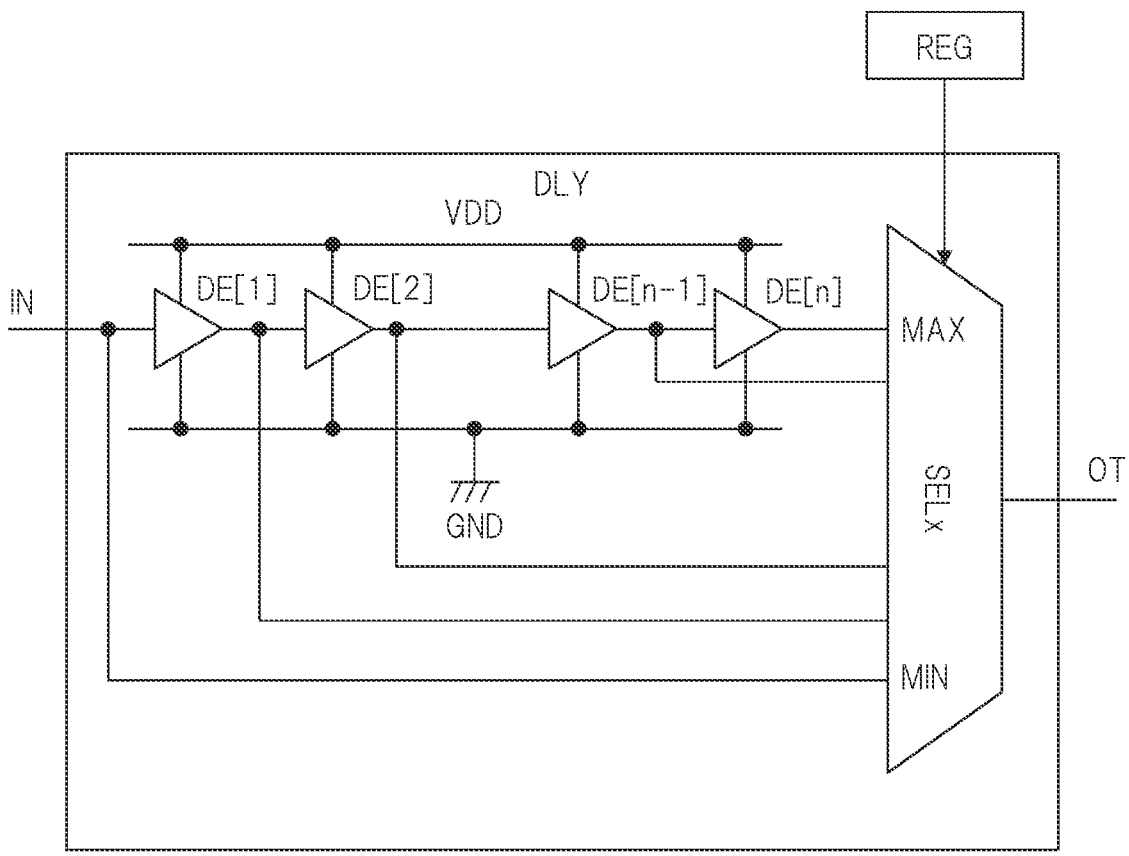
FIG. 2 is a circuit diagram showing a configuration example of each delay circuit of FIG. 1.

FIG. 2 is a circuit diagram showing a configuration example of each delay circuit of FIG. 1. A delay circuit DLY shown in FIG. 2 includes delay elements DE[1], DE[2], . . . DE[n−1] and DE[n] having plural steps (n steps) to which the input signal IN is input, and a selector SELx. When the delay circuit DLY is the strobe delay circuit DLY1, the input signal IN is the strobe signal DQS that is output from the processor PRC. When the delay circuit DLY is the data delay circuit DLY2, the input signal IN is the data signals D1 and D2 that are output from the processor PRC through the selector SELd or others.

The selector SELx delays the input signal IN by an optional delay value between the minimum value and the maximum value by selecting any input or any output of the delay elements DE[1] . . . , and DE[n] having the plural steps, and outputs an output signal OT resulted from, the delay. In this example, the minimum value MIN corresponds to the input of the delay element DE[1], and the maximum value MAX corresponds to the output of the delay element DE[n]. The selection made by the selector SELx is based on the register REG of FIG. 2 corresponding to the registers REG1 and REG2 of FIG. 1.

<<Details of Calibration Circuits>>

Figure 3:
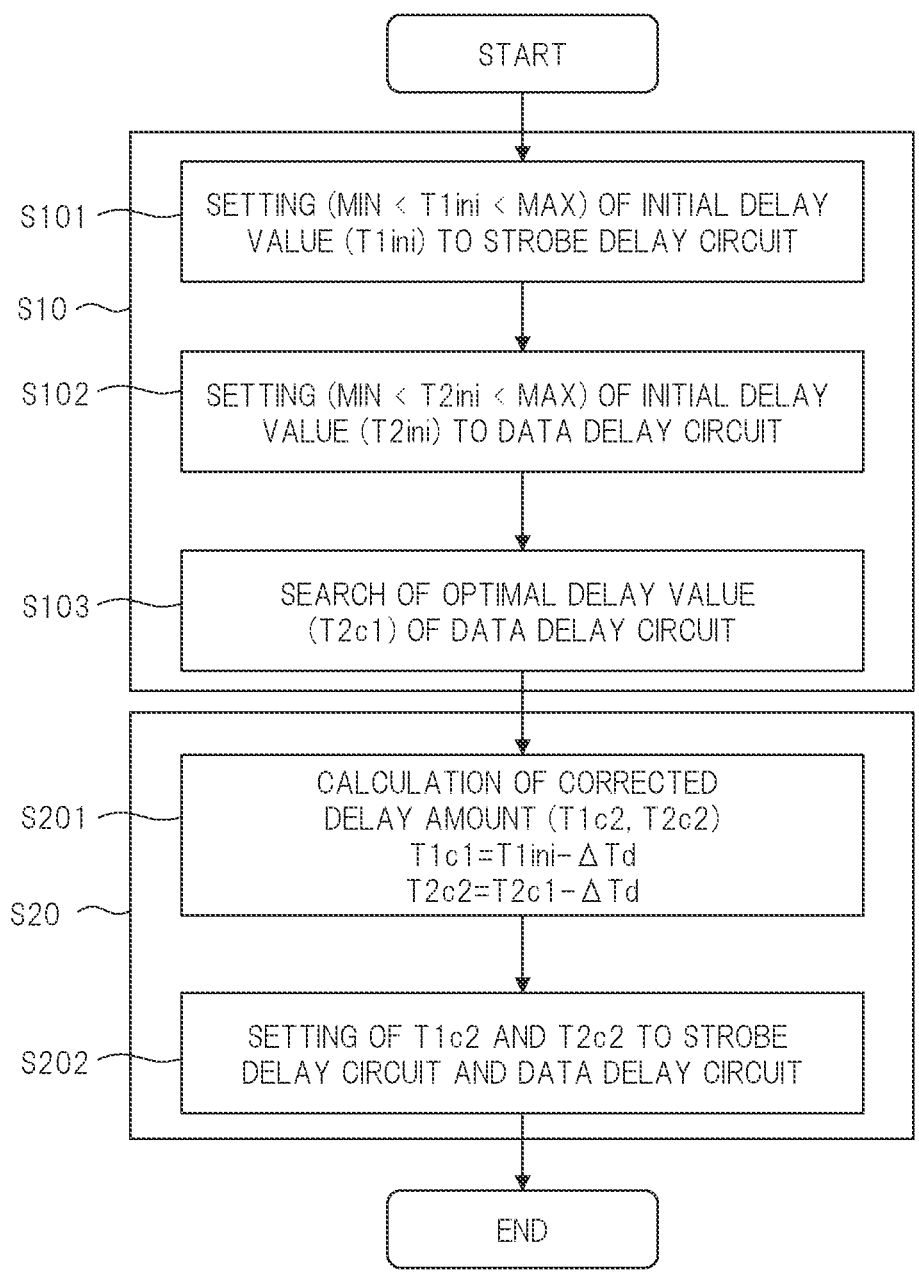
FIG. 3 is a flowchart showing one example of a process content of each calibration circuit of FIG. 1.
Figure 4:
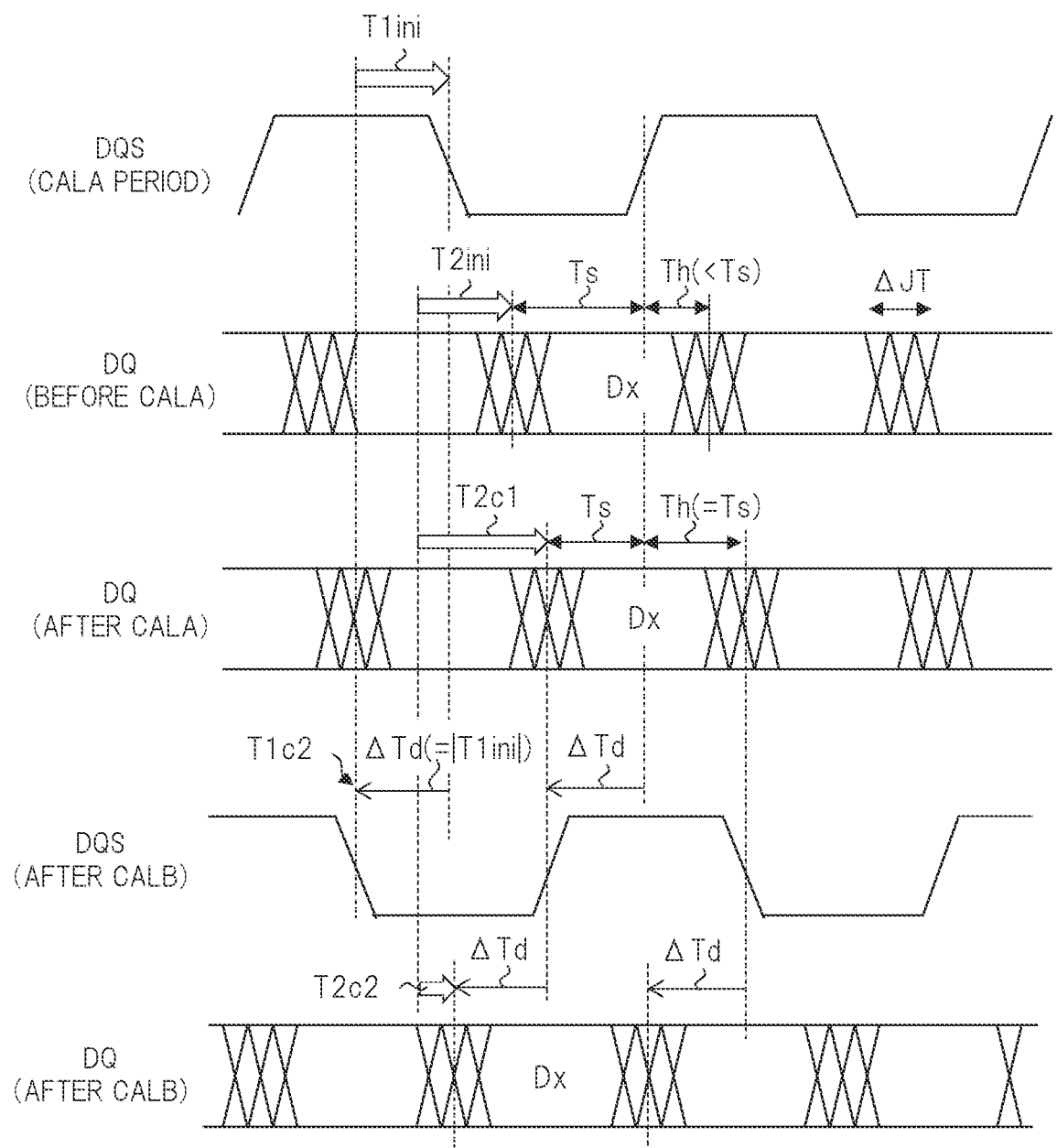
FIG. 4 is a waveform diagram for explaining a specific example of the process content of FIG. 3.

FIG. 3 is a flowchart showing one example of a process content of each calibration circuit of FIG. 1. FIG. 4 is a waveform diagram for explaining a specific example of the process content of FIG. 3. In FIG. 3, a step S10 shows a process content of the calibration circuit CALA of FIG. 1, and a step S20 shows a process content of the calibration circuit CALB of FIG. 1. In FIG. 3, first, the calibration circuit CALA determines the delay value of the strobe delay circuit DLY1 through the register REG1 to be an initial delay value T1$ini$ that is larger than the minimum value MIN and smaller than the maximum value MAX (step S101).

The calibration circuit CALA determines the delay value of the data delay circuit DLY2 through the register REG2 to be an initial delay value T2$ini$ that is larger than the minimum value MIN and smaller than the maximum value MAX (step S102). For example, in FIG. 2, it is assumed that each of the delay circuits DLY has "n=256". In this case, the calibration circuit CALA determines the initial delay values T1$ini$ and T2$ini$ to be, for example, a middle value between the minimum value MIN and the maximum value MAX to make the selector SELx select the output of the delay element DE[128].

Under this state, the calibration circuit CALA searches an optimal delay value T2$c1$ of the data delay circuit DLY2 (step S103). As a specific example, in the setting of the initial delay values T1$ini$ and T2$ini$ in FIG. 4, the set-up time Ts of the data signal DQ with respect to the strobe signal DQS is larger than the hold time Th at an input end of the memory MEM. As shown in FIG. 4, the calibration circuit CALA searches an optimal delay value T2$c1$ to make the set-up time Ts and the hold time Th of this data signal DQ equal to each other.

The process of this step S103 is achieved by using various publicly-known methods. Typically, the calibration circuit CALA only needs to write a predetermined data signal DQ onto the memory MEM while sequentially changing the delay value of the data delay circuit DLY2, and check whether the written data signal can be correctly read out or not for every writing. In this manner, the calibration circuit CALA can detect the minimum delay value and the maximum delay value by which the data signal can be correctly read out. In this case, the calibration circuit CALA only needs to determine the optimal delay value T2$c1$ to be the middle value between the detected minimum delay value and the detected maximum delay value.

Such optimal delay values determined by the calibration circuit CALA, in other words, the initial delay value T1$ini$ of the strobe delay circuit DLY1 and the optimal delay value T2$c1$ of the data delay circuit DLY2 can be values that are larger than the minimum value MIN and smaller than the maximum value MAX. Meanwhile, each of the delay elements DE[1], . . . , DE[n] having the plural steps in the delay circuit DLY of FIG. 2 is made of, for example, an even number of CMOS (Complementary Metal Oxide Semiconductor) inverter circuits or others operated at a power supply voltage VDD and a ground power supply voltage GND.

In this case, along with the increase in power-supply noises or others, the larger the number of steps of the set delay elements DE[1], . . . , DE[n] is, the more the jitter component contained in the strobe signal DQS and the data signal DQ is. FIG. 4 shows a jitter component ΔJT contained in the data signal DQ as one example. The increase in the jitter component decreases a margin for the set-up time Ts and the hold time Th. And, since the allowable value of the jitter component of the memory such as the DDR-SDRAM is defined by the standards in some cases, the increase in the jitter component has a risk of not satisfying the standards.

Accordingly, in FIG. 3, the calibration circuit CALB shifts both the optimal delay value T2$c1$ and the initial delay value T1$ini$ that is the optimal delay value determined by the calibration circuit CALA by the same correction value ΔTd in a direction toward the minimum value MIN. In this manner, the calibration circuit CALB determines a corrected delay value T1$c2$ (=T1$ini$−ΔTd) and a corrected delay value T2$c2$ (=T2$c1$−ΔTd) (step S201). Then, the calibration circuit CALB determines these corrected delay values T1$c2$ and T2$c2$ to the strobe delay circuit DLY1 and the data delay circuit DLY2, respectively (step S202).

In this manner, while the set-up time Ts and the hold time Th are maintained, the number of steps of the delay elements DE[1], . . . , DE[n] that are set in each delay circuit DLY can be decreased. As a result, the jitter component can be decreased. In this case, the calibration circuit CALB is particularly desirable to determine the corrected delay value T1$c2$ to be the minimum value MIN of the strobe delay circuit DLY1 or the corrected delay value T2$c2$ to be the minimum value MIN of the data delay circuit DLY2.

Specifically, the calibration circuit CALB is desirable to detect the minimum delay value among the respective delay values of the strobe delay circuit DLY1 and the data delay circuit DLY2 determined by the calibration circuit CALA, and determine the corrected value ΔTd to be the detected minimum delay value. In this manner, the number of steps of the delay elements DE[1], . . . , DE[n] set in the respective delay circuits IDLY can be minimized, and the jitter component can be more decreased.

As a specific example, in a case of "T2$ini$<T2$c1$" that is "Ts>Th" as shown in FIG. 4, the calibration circuit CALB determines the corrected value ΔTd to be the initial delay value T1$ini$ that is the minimum delay value. As a result, the corrected delay value T1$c2$ becomes the minimum value MIN, and the corrected delay value T2$c2$ becomes a value of "T2$c1$−T1$ini$". Although not illustrated, the same goes for a case of "T2$ini$>T2$c1$", in other words, a case of "Ts<Th". In this case, the calibration circuit CALB determines the corrected value ΔTd to be the optimal delay value T2$c1$ that is the minimum delay value. As a result, the corrected delay value T1$c2$ becomes a value of "T1$ini$−T2$c1$", and the corrected delay value T2$c2$ becomes the minimum value MIN.

<<Modification Example of Semiconductor Device>>

In the example of FIG. 1, the strobe delay circuit DLY1 and the data delay circuit DLY2 are arranged on the input sides of the strobe output buffer OBFs and the data output buffer OBFd. However, in addition to or in place of this arrangement, the strobe delay circuit DLY1 and the data delay circuit DLY2 may be arranged on the output sides of the strobe input buffer IBFs and the data input buffer IBFd.

In this case, the adjustment for the timing that is the adjustment for the delay value as similar to those of FIGS. 3 and 4 is performed to the strobe signal that is output from the strobe input buffer IBFs and the data signal that is output from the data input buffer IBFd. This manner can expand a margin of the timing at which the interface circuit IFC latches this data signal by this strobe signal. In this case, the calibration circuit CALA can be achieved by any of publicly-known various methods represented by, for example, the method described in the Patent Document 1.

<<Main Effect of First Embodiment>>

As described above, the jitter component can be representatively decreased by the usage of the method of the first embodiment. As a result, the margin for the timing of the set-up time Ts and the hold time Th or others can be expanded, and this result can contribute to, for example, higher speed performance of the semiconductor device, moderation of the timing limit for the package design and the PCB design, and others. Besides, in order to suppress the jitter component caused by the power-supply noises, for example, connection of a decoupling capacitor having a certain large capacitance to the power supply voltage VDD in FIG. 2 is also conceivable. In the usage of the method of the first embodiment, the influence of the power-supply noises is difficult to be caused, and therefore, the capacitance of the decoupling capacitor that is an area of the same can be decreased.

In the example of FIG. 1, note that both the calibration circuits CALA and CALB are achieved by a program processing using the processor PRC. The achievement is not limited to this, and either one or both of the calibration circuits CALA and CALB may be achieved by, for example, a hardware circuit inside the memory controller MCTL. Specifically, for example, a sequencer circuit or others may be arranged as the hardware circuit. However, for example, if the calibration circuit CALA is already achieved by the hardware circuit, addition of the calibration circuit CALB achieved by the program processing can provide various effects of the first embodiment without change of the hardware.

Second Embodiment

<<Outline of Semiconductor Device>>

Figure 5:
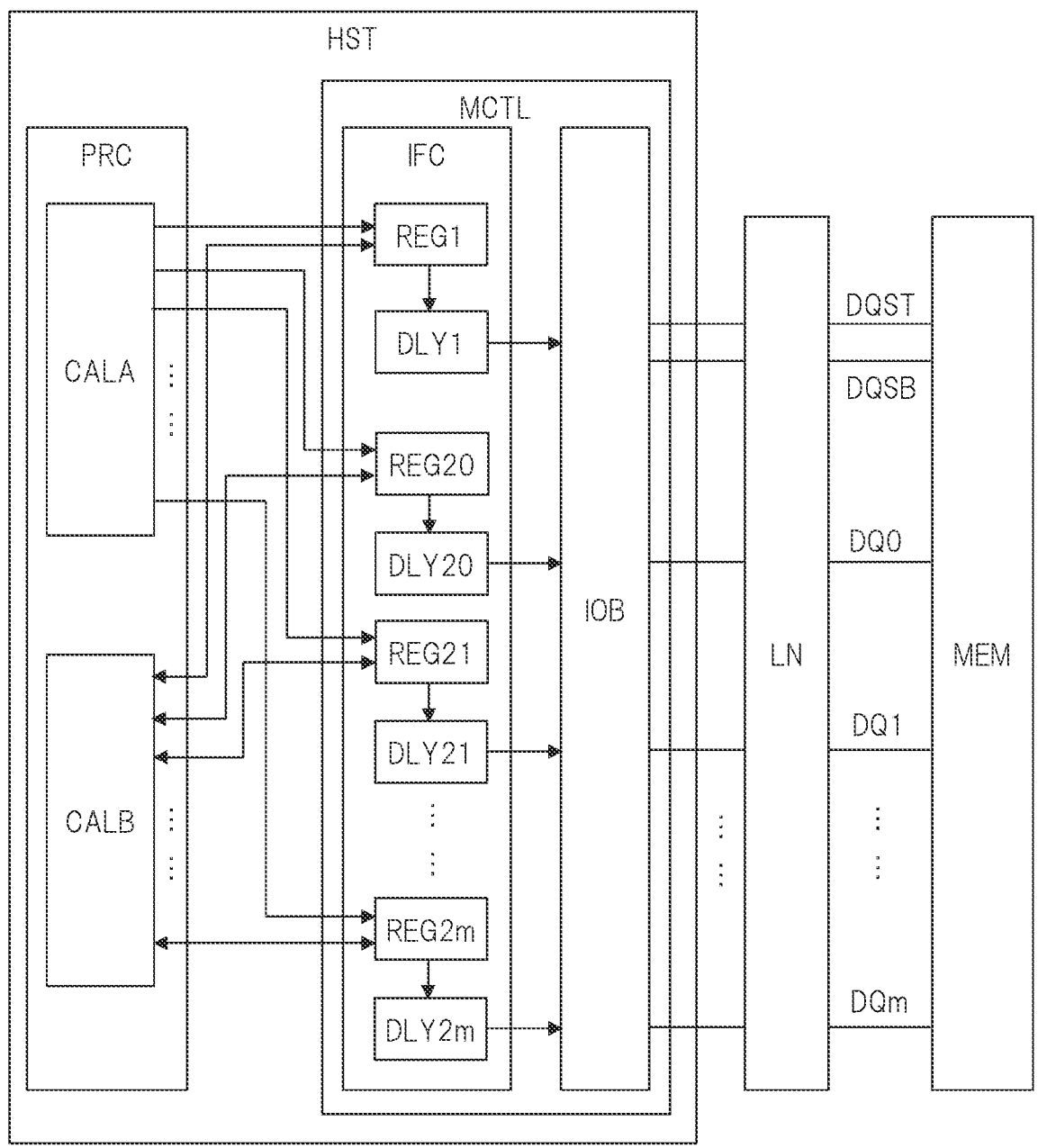
FIG. 5 is a schematic diagram showing a configuration example of a principle part of a semiconductor device according to a second embodiment of the present invention.

FIG. 5 is a schematic diagram showing a configuration example of a principal part of a semiconductor device according to a second embodiment of the present invention. In FIG. 5 as different from the configuration of FIG. 1, the host controller HST and the memory MEM transmit/receive a plurality of (m+1) data signals DQ0, DQ1, . . . , DQm to/from each other. Because of this, the interface circuit IFC includes a plurality of data delay circuits DLY20, DLY21, . . . , DLY2m and a plurality of registers REG20, REG21, . . . , REG2m.

The plurality of data delay circuits DLY20, DLY21, . . . , DLY2m delay the plurality of data signals DQ0, DQ1, . . . , DQm, respectively. The plurality of registers REG20, REG21, . . . , REG2m set delay values of the plurality of data delay circuits DLY20, DLY21, . . . , DLY2m, respectively. The respective calibration circuits CALA and CALB determine the delay values of the plurality of registers REG20, REG21, . . . , REG2m in addition to the register REG1 of the strobe delay circuit DLY1. Note that a pair of strobe signals DQST and DQSB are generally arranged for one-byte data signals DQ0 to DQ7.

In this case, as similar to the first embodiment, the calibration circuit CALB detects the minimum delay value among the respective delay values of the plurality of data delay circuits DLY20 to DLY2m and the strobe delay circuit DLY1 determined by the calibration circuit CALA, and determines the corrected value ΔTd based on this detected minimum delay value. For example, when the delay value of the strobe delay circuit DLY1 is 128 while the respective delay values of the data delay circuits DLY20 and DLY21 are 108 and 138, the corrected value ΔTd is determined to be 108. As a result, the corrected delay value of the strobe delay circuit. DLY1 becomes 20 (=128−108), and the respective delay values of the data delay circuits DLY20 and DLY21 become 0 (=108−108) and 30 (=138−108).

<<Main Effect of Second Embodiment>>

As described above, even in the case of the arrangement of the plurality of data signals DQ, the usage of the method of the second embodiment can provide the same effects as the various effects described in the first embodiment. And, power consumption of each delay circuit DLY may be increased by the increase in the number of data signals DQ. The usage of the method of the second embodiment to decrease the number of operating delay elements can contribute to the reduction in the power consumption. Note that the method of the second embodiment may be applied to not only the transmission side to the memory MEM but also the reception side from the memory MEM as similar to the case of the first embodiment.

In the foregoing, the present invention made by the present inventors has been concretely described on the basis of the embodiments. However, the present invention is not limited to the foregoing embodiments, and various modifications can be made within the scope of the present invention. For example, the above-described embodiments have been explained for easily understanding the present invention, and are not always limited to the one including all structures explained above. Also, a part of the structure of one embodiment can be replaced with the structure of another embodiment, and besides, the structure of another embodiment can be added to the structure of one embodiment. Further, another structure can be added to/eliminated from/replaced with a part of the structure of each embodiment.

For example, the above-described method of each embodiment is applicable to the interface circuit inside not only the host controller HST but also the memory MEM. Further, the above-described method of each embodiment is intended to not only such a memory use, but is also applicable to, for example, a semiconductor device for communication or others that performs data communication by transmitting/receiving strobe signals (or clock signals) and data signals.

What is claimed is:

1. A semiconductor device comprising:
a first delay circuit including a first delay element having plural steps to which a strobe signal for latching a data signal is input, and delaying the strobe signal by an optional delay value between the minimum value and the maximum value by selecting any input or any output of the first delay element having plural steps;
a second delay circuit including a second delay element having plural steps to which the data signal is input, and delaying the data signal by an optional delay value between the minimum value and the maximum value by selecting any input or any output of the second delay element having plural steps;
a first calibration circuit searching a second delay value of the second delay circuit while determining a delay value of the first delay circuit to be a first delay value that is larger than the minimum value and smaller than the maximum value; and
a second calibration circuit determining a first corrected delay value and a second corrected delay value by shifting both the first delay value and the second delay value by the same correction value in a direction toward the minimum value, and setting the first corrected delay value and the second corrected delay value to the first delay circuit and the second delay circuit, respectively.

2. The semiconductor device according to claim 1,
wherein the second calibration circuit determines the first corrected delay value to be the minimum value of the first delay circuit or the second corrected delay value to be the minimum value of the second delay circuit.

3. The semiconductor device according to claim 2 further comprising:
a plurality of the second delay circuits delaying a plurality of the data signals,
wherein the second calibration circuit detects the minimum delay value among the delay values of the plurality of second delay circuits and the first delay circuit determined by the first calibration circuit, and determines the corrected value based on the detected minimum delay value.

4. The semiconductor device according to claim 1,
wherein the data signal and the strobe signal are transmission signals to a DRAM (Dynamic Random Access Memory) or reception signals from the DRAM.

5. A semiconductor device comprising:
a first semiconductor chip on which a DRAM (Dynamic Random Access Memory) is mounted;
a second semiconductor chip transmitting or receiving a data signal and a strobe signal to or from the first semiconductor chip; and
a transmission line connecting the first semiconductor chip and the second semiconductor chip,
wherein the strobe signal is a signal for latching the data signal,
the second semiconductor chip includes:
   a first delay circuit including a first delay element having plural steps to which the strobe signal is input, and delaying the data signal by an optional delay value between the minimum value and the maximum value by selecting any input or any output of the first delay element having plural steps;
   a second delay circuit including a second delay element having plural steps to which the data signal is input, and delaying the strobe signal by an optional delay value between the minimum value and the maximum value by selecting any input or any output of the second delay element having plural steps;
   a first calibration circuit searching a second delay value of the second delay circuit while determining a delay value of the first delay circuit to be a first delay value that is larger than the minimum value and smaller than the maximum value; and
   a second calibration circuit determining a first corrected delay value and a second corrected delay value by shifting both the first delay value and the second delay value by the same correction value in a direction toward the minimum value, and setting the first corrected delay value and the second corrected delay value to the first delay circuit and the second delay circuit, respectively.

6. The semiconductor device according to claim 5,
wherein the second calibration circuit determines the first corrected delay value to be the minimum value of the first delay circuit or the second corrected delay value to be the minimum value of the second delay circuit.

7. The semiconductor device according to claim 6,
wherein the second semiconductor chip includes a plurality of the second delay circuits delaying a plurality of the data signals, and
the second calibration circuit detects the minimum delay value among the delay values of the plurality of second delay circuits and the first delay circuit determined by the first calibration circuit, and determines the corrected value based on the detected minimum delay value.

\* \* \* \* \*